(12) United States Patent
Yamanaka et al.

(10) Patent No.: US 8,027,110 B1
(45) Date of Patent: Sep. 27, 2011

(54) APPARATUS FOR MEASURING MAGNETIC FIELD OF MICROWAVE-ASSISTED HEAD

(75) Inventors: Noboru Yamanaka, Tokyo (JP);
Tomoyuki Sasaki, Tokyo (JP); Takuya Adachi, Tokyo (JP); Isamu Sato, Tokyo (JP); Hiroshi Ikeda, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 12/844,348

(22) Filed: Jul. 27, 2010

(51) Int. Cl.
*G11B 27/36* (2006.01)
(52) U.S. Cl. .......................................... 360/31
(58) Field of Classification Search ............ 360/31, 360/46, 55, 69, 125, 126; 428/336; 324/210; 725/131; 340/10.42, 72.2
See application file for complete search history.

(56) References Cited

U.S. PATENT DOCUMENTS

| | | | | |
|---|---|---|---|---|
| 3,833,931 | A * | 9/1974 | Bonori et al. | 365/152 |
| 4,209,783 | A * | 6/1980 | Ohyama et al. | 340/10.42 |
| 4,249,167 | A * | 2/1981 | Purinton et al. | 340/572.2 |
| 5,416,451 | A | 5/1995 | Kaltenecker et al. | |
| 6,785,092 | B2 | 8/2004 | Covington et al. | |
| 7,454,170 | B2 * | 11/2008 | Goossens et al. | 455/41.1 |
| 7,791,838 | B2 * | 9/2010 | Sato et al. | 360/125.02 |
| 2003/0039068 | A1 | 2/2003 | Crawford et al. | |
| 2005/0034169 | A1 | 2/2005 | Maeda et al. | |
| 2007/0253106 | A1 | 11/2007 | Sato et al. | |
| 2009/0219018 | A1 | 9/2009 | Shimazawa | |
| 2010/0068512 | A1 * | 3/2010 | Imaoka et al. | 428/336 |
| 2011/0043943 | A1 * | 2/2011 | Igarashi et al. | 360/59 |

FOREIGN PATENT DOCUMENTS

| | | |
|---|---|---|
| JP | A-H06-296113 | 10/1994 |
| JP | A-2000-353309 | 12/2000 |
| JP | A-2006-50472 | 2/2006 |
| JP | A-2009-301610 | 12/2009 |
| JP | A-2010-73286 | 4/2010 |

OTHER PUBLICATIONS

J. Zhu, et al., "Microwave Assisted Magnetic Recording," *IEEE Transaction on Magnetics*, vol. 44, No. 1, pp. 125-131 (2008) (Discussed on p. 2 of the Specification).

* cited by examiner

*Primary Examiner* — Fred Tzeng
(74) *Attorney, Agent, or Firm* — Posz Law Group, PLC

(57) ABSTRACT

A measurement circuit system of a magnetic field measurement apparatus of the present invention includes an amplifier, a mixer circuit and a band-pass filter that are connected in order on an output end side of a microstrip line or a coplanar wave guide, which is an in-plane high frequency magnetic field intensity measurement element, a frequency immediately before being inputted in the band-pass filter is down-converted by the mixer circuit to a frequency so that a band width of the band-pass filter can be used, the band-pass filter uses a narrow band of ±0.5-±10 KHz (1 KHz-20 KHz as a bandwidth) centering a fundamental frequency selected from 5-20 MHz that is down-converted by the mixer circuit as a center peak passing frequency, and the measurement circuit system is configured to obtain 3 dB or greater of a signal-to-noise ratio (SNR) that is a ratio of S with N; where S represents the reproduction voltage (reproduction output) of the high frequency reproduction signal induced by the in-plane high frequency magnetic field intensity measurement element, and N represents a total noise voltage of a circuit noise including a noise generated by the in-plane high frequency magnetic field intensity measurement element. Therefore, the in-plane high frequency magnetic field that a microwave-assisted magnetic head generates can be measured with high reliability and precision.

12 Claims, 15 Drawing Sheets

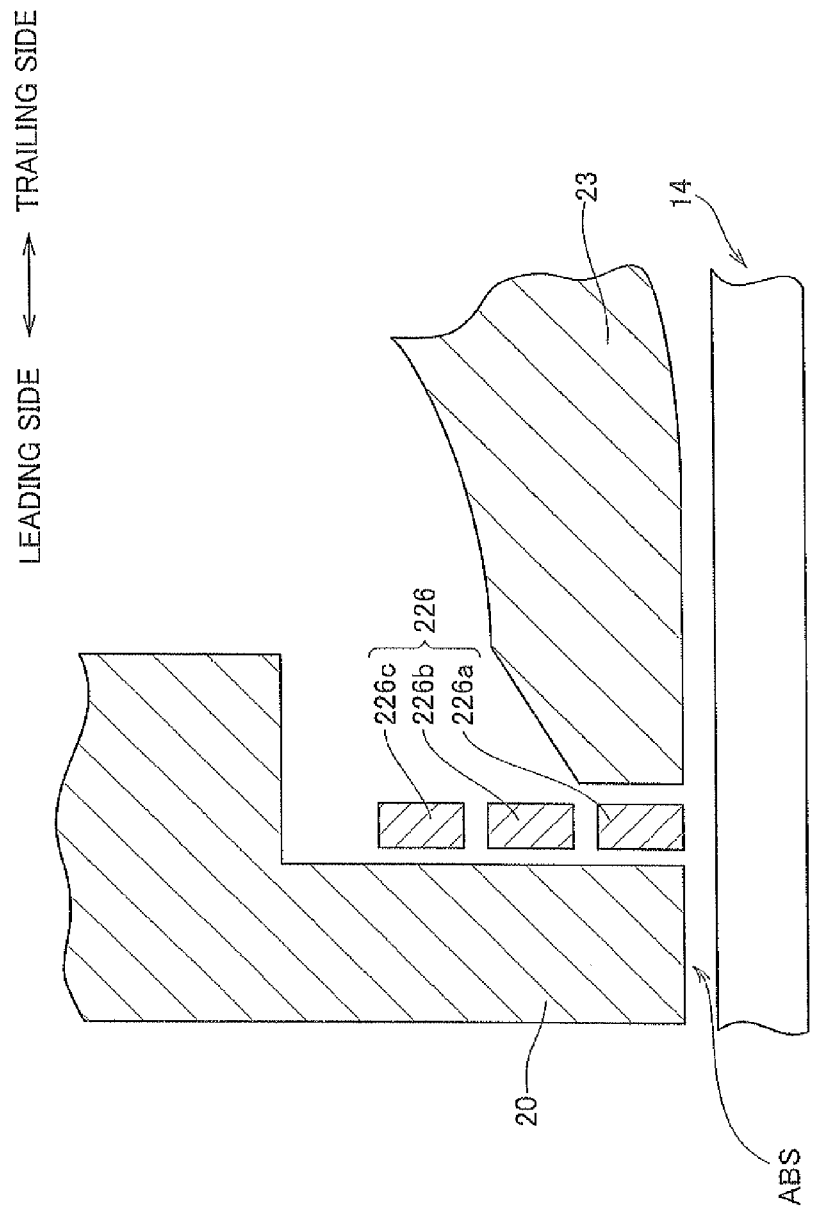

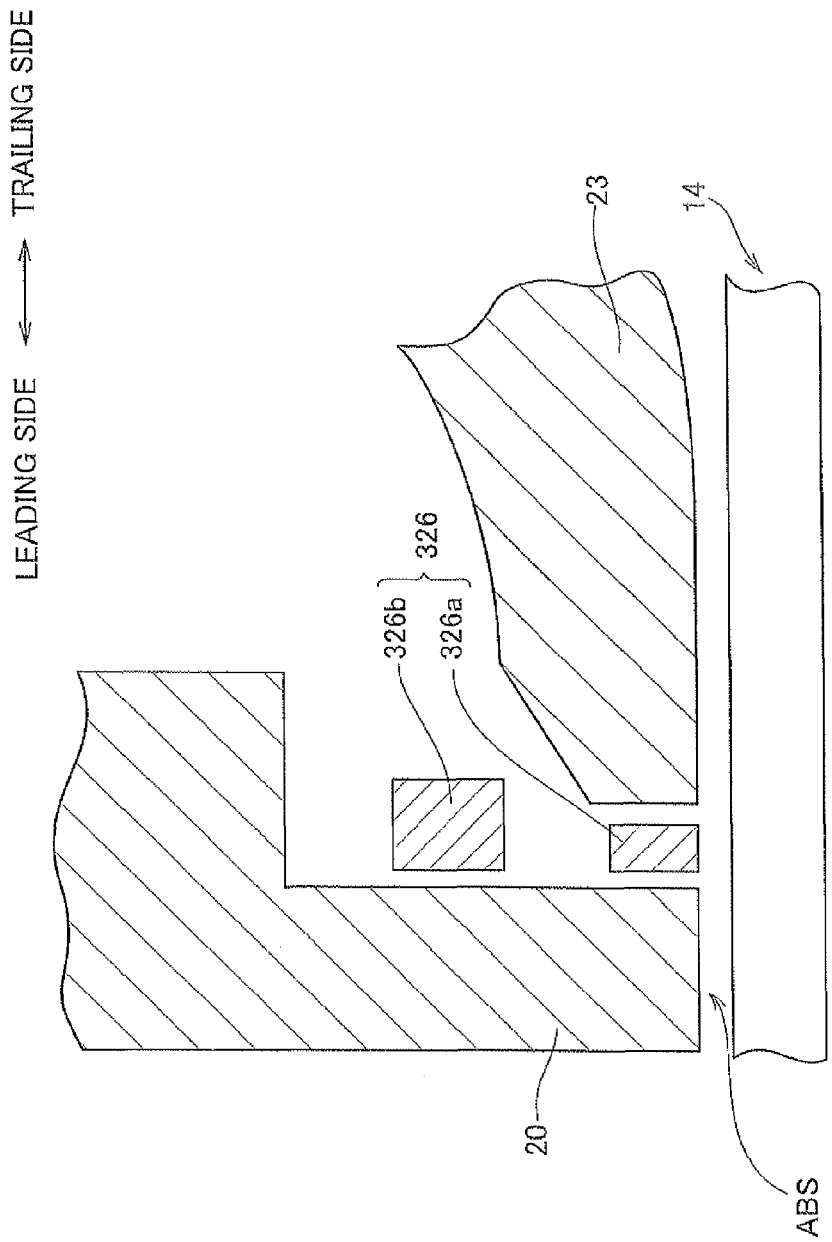

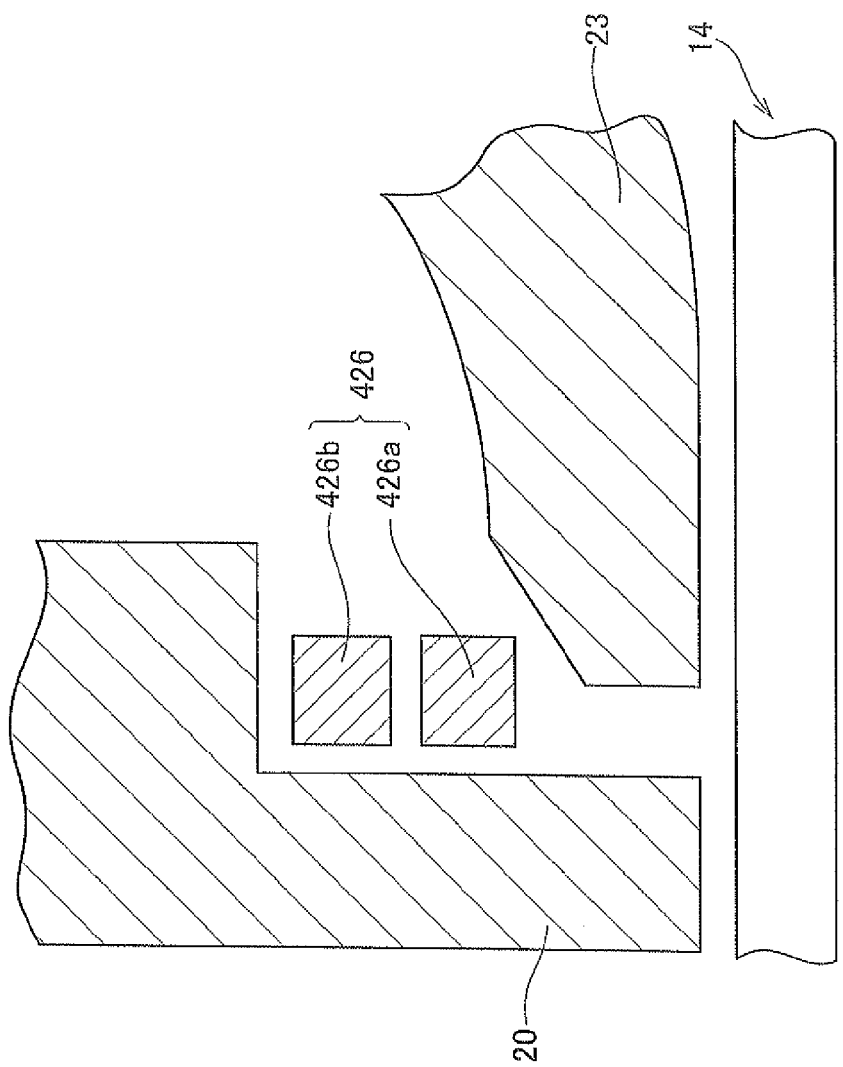

APPARATUS FOR MEASURING MAGNETIC FIELD OF MICROWAVE-ASSISTED HEAD

BACKGROUND

1. Field of the Invention

The present invention relates to an apparatus for measuring an in-plane high frequency magnetic field generated from a microwave-assisted magnetic head.

2. Description of Conventional Art

Conventionally, improvements in a longitudinal recording density for a magnetic recording medium, such as a hard disk, have been attempted by making magnetic particles that form a magnetic recording layer minute, improving the material, and micro-structuring the magnetic head. In addition, a perpendicular recording type magnetic recording and reproducing device is being utilized recently in which further improvements in the surface recording density have been attempted by magnetizing a recording layer in a direction perpendicular to a surface of the magnetic recording medium. Yet further improvements in the longitudinal recording density are expected in the future.

In contrast, a thermal fluctuation easily occurs in recording magnetization as a result of making recording bits and magnetic particles minute. Therefore, it is preferable that the magnetic particles that have large magnetic anisotropy energy Ku (magnetic anisotropy magnetic field Hk) and a large coercive force Hc are used for the material for the recording layer.

However, when the magnetic particles with large magnetic anisotropy energy Ku are used for the material for the recording layer, the coercive force Hc of the recording layer becomes a large value, such as 4 KOe. It is said that a recording magnetic field that is more than twice of the coercive force is generally needed for saturation magnetic recording. Therefore, with the performance of the conventional magnetic head, it has been occasionally extremely difficult to saturation-magnetize the recording layer. That is, there have been cases where recording and deleting magnetic data are difficult.

Data is magnetically recorded on a magnetic recording medium by applying electric current to a primary coil positioned adjacent to a main magnetic pole of the magnetic head and using a perpendicular recording magnetic field that is generated from a front end of the main magnetic pole. It has been considered to dramatically reduce the perpendicular recording magnetic field needed for such a magnetic reversal by superposing an alternating current (AC) magnetic field in an in-plane direction in a microwave band that is equivalent to, or close to, a ferromagnetic resonance frequency of the recording medium onto a perpendicular recording magnetic field that induces the magnetic reversal. This assisted recording method is called a microwave-assisted magnetic recording (MAMR), and effects have been verified through experiments.

Mainly two types of MAMR have been proposed. One type is a type that generates a microwave magnetic field in the in-plane direction by forming a spin torque oscillator (STO) formed of a multilayer magnetic thin film in a gap between the main magnetic pole and an auxiliary magnetic pole of the recording head, and by driving a bias electric current to oscillate the STO, as discussed in Document 1 (J. Zhu et al.; IEEE Transaction on Magnetics, Vol. 44, No. 1, p. 125) (this may be called a self-excited type).

Another type is a type that provides a secondary coil in, or adjacent to, the gap between the main magnetic pole and the auxiliary magnetic pole of the magnetic head and that drives a microwave band AC to the secondary coil to generate the in-plane AC magnetic field, as discussed in Document 2 (US Patent Application Publication No. 2007-253106) (this may be called an induced type).

In consideration of mass production and utilization of such a magnetic head, to secure the reliability of the device, the in-plane high frequency magnetic field intensity generated by the microwave-assisted magnetic head must be precisely measured for each magnetic head, and a highly sensitive and low-cost property measurement apparatus must be developed.

However, the development of the device has the following significant technical issues:

(1) For both the self-excited type and the induced type, the gap between, or adjacent to, the main magnetic pole and the auxiliary magnetic pole that generates the in-plane high frequency magnetic field is assumed to be, at most, approximately 30 nm. Therefore, the in-plane high-frequency magnetic field is generated from an extremely minute region;

(2) To express the effects of microwave assistance, a strong in-plane high frequency magnetic field of 2 KOe or greater, for example, is required, and such in-plane high frequency magnetic field must be present; and (3) The frequency of the in-plane high frequency magnetic field is equal to, or close to, the ferromagnetic resonance frequency of the recording layer of the magnetic recording medium that is subjected to recording, and is generally approximately 10 GHz to 40 GHz, which is extremely high.

In contrast, as a method for measuring the recording magnetic field of a conventional longitudinal recording magnetic head, there has been proposed a method for measuring the recording magnetic field by positioning a magnetic sensor, more specifically a giant magnetoresistive (GMR) head, facing a flying surface of the magnetic head (JP Patent Application Laid-Open Publication No. 2009-301610).

However, the method proposed by the above publication suggests that the frequency of the recording drive current is approximately 20-700 MHz. This frequency is totally different from the frequency band of 10 GHz to 40 GHz, which is the frequency expressed by the microwave-assisted magnetic head.

Further, because an element resistance is low and the output is small when a GMR head is used as the measurement sensor, it is extremely difficult to conduct a reliable measurement simply by adjacently positioning the sensor since the signal-noise (S/N) ratio for the measurement signal cannot be securely set.

The present invention was created based on such facts. An object of the present invention is to provide a new measurement apparatus that allows precise measurement of the in-plane high frequency magnetic field generated by the microwave-assisted magnetic head with high reliability.

Such measurement apparatus can secure high density recording and improvements in recording quality and contribute to a succinct shipping inspection, a low cost and a high throughput.

SUMMARY

To solve the above problems, the present invention is a magnetic field measurement apparatus that measures an in-plane high frequency magnetic field intensity generated from a microwave generation mechanism provided in a microwave-assisted magnetic head. The magnetic field measurement apparatus includes a fixing mechanism that fixes the microwave-assisted magnetic head that is a subject to be measured; a high frequency current drive system that applies a high frequency current to the microwave generation mechanism provided in the microwave-assisted magnetic head; an in-plane high frequency magnetic field intensity measurement element that measures the in-plane high frequency magnetic field intensity generated from the microwave generation mechanism, the in-plane high frequency magnetic field intensity measurement element being one of a microstrip line and a coplanar wave guide that functions to obtain a production output voltage by electromagnetic induction from the in-plane high frequency magnetic field generated from the microwave generation mechanism; a measurement circuit system connected to the one of the microstrip line and the coplanar wave guide, which is the in-plane high frequency magnetic field intensity measurement element; and a three-dimensionally movable stage on which is mounted the one of the microstrip line and the coplanar wave guide, which is the in-plane high frequency magnetic field intensity measurement element. Wherein, the measurement circuit system includes an amplifier, a mixer circuit and a band-pass filter that are connected in order on an output end side of the in-plane high frequency magnetic field. A frequency immediately before being inputted in the band-pass filter is down-converted by the mixer circuit to a frequency so that a band width of the band-pass filter can be used, the band-pass filter uses a narrow band of ±0.5-±10 KHz (1 KHz-20 KHz as a bandwidth) centering a fundamental frequency selected from 5-20 MHz that is down-converted by the mixer circuit as a center peak passing frequency, and the measurement circuit system is configured to obtain 3 dB or greater of a signal-to-noise ratio (SNR) that is a ratio of S with N; where S represents the reproduction voltage (reproduction output) of the high frequency reproduction signal induced by the in-plane high frequency magnetic field intensity measurement element, and N represents a total noise voltage of a circuit noise including a noise generated by the in-plane high frequency magnetic field intensity measurement element.

In the preferred embodiment of the magnetic field measurement apparatus of the present invention, the band-pass filter uses a narrow band of ±1.5-±5 KHz (3 KHz-10 KHz as a bandwidth) centering the fundamental frequency selected from 5-20 MHz that is down-converted by the mixer circuit as the center peak passing frequency.

In the preferred embodiment of the magnetic field measurement apparatus of the present invention, the fundamental frequency down-converted by the mixer circuit and inputted to the band-pass filter and the narrow bandwidth of the band-pass filter are determined such that 3 dB or greater is obtained for the SNR.

In the preferred embodiment of the magnetic field measurement apparatus of the present invention, the amplifier in the measurement circuit system includes a pre-amplifier and a main-amplifier that are connected in this order.

In the preferred embodiment of the magnetic field measurement apparatus of the present invention, the amplifier in the measurement circuit system is a main-amplifier.

In the preferred embodiment of the magnetic field measurement apparatus of the present invention, a comparator is connected to the measurement circuit system next to the band-pass filter.

In the preferred embodiment of the magnetic field measurement apparatus of the present invention, by a control of the three-dimensionally movable stage, a center line of the one of the microstrip line or the coplanar wave guide is positioned along and opposes a center line of a recording gap of the microwave-assisted magnetic head that is the subject to be measured that is fixed by the fixing mechanism, and a spacing between the center line of the recording gap and the center line of the one of the microstrip line or the coplanar wave guide is configured to be finely controlled.

In the preferred embodiment of the magnetic field measurement apparatus of the present invention, the coplanar wave guide is of a short circuit type.

In the preferred embodiment of the magnetic field measurement apparatus of the present invention, the microwave-assisted head that is the subject to be measured includes a main magnetic pole, an auxiliary magnetic pole, a primary coil for generating a perpendicular recording magnetic field at the main magnetic pole, and a secondary coil for driving a microwave band alternating current in a gap and/or in a vicinity of the gap formed by the main magnetic pole and the auxiliary magnetic pole.

In the preferred embodiment of the magnetic field measurement apparatus of the present invention, an in-plane alternating current magnetic field is generated by driving the alternating current in the microwave band to the secondary coil of the microwave-assisted magnetic head, and a frequency of the alternating current is substantially equal to a ferromagnetic resonance frequency of a recording layer of a magnetic recording medium that is subjected to recording, and is in a range of 10 GHz to 40 GHz.

In the preferred embodiment of the magnetic field measurement apparatus of the present invention, the microwave-assisted magnetic head that is the subject to be measured includes a main magnetic pole, an auxiliary magnetic pole, a primary coil for generating a perpendicular recording magnetic field at the main magnetic pole, and a spin torque oscillator formed of a multilayer magnetic thin film for generating a microwave band alternating current in a gap and/or in a vicinity of the gap formed by the main magnetic pole and the auxiliary magnetic pole.

In the preferred embodiment of the magnetic field measurement apparatus of the present invention, an in-plane alternating current magnetic field is generated by driving a bias current to the spin torque oscillator of the microwave-assisted magnetic head to oscillate the spin torque oscillator, and an oscillation frequency of the spin torque oscillator is substantially equal to a ferromagnetic resonance frequency of a recording layer of a magnetic recording medium that is subjected to recording, and is in a range of 10 GHz to 40 GHz.

BRIEF DESCRIPTION OF THE DRAWINGS

FIG. 13 is a schematic cross-sectional view showing an enlarged view of the vicinity of the ABS and a cross-section that is perpendicular to the track width direction according to another embodiment of a thin film magnetic film of a type that includes a secondary coil between the main magnetic pole and the auxiliary magnetic pole of a magnetic head and generates an in-plane AC magnetic field by driving a microwave band AC to the secondary coil (reference number 14 indicates a magnetic recording medium illustrated for reference to clarify positional relationships).

FIG. 14 is a schematic cross-sectional view showing an enlarged view of the vicinity of the ABS and a cross-section that is perpendicular to the track width direction according to another embodiment of a thin film magnetic film of a type that includes a secondary coil between the main magnetic pole and the auxiliary magnetic pole of a magnetic head and generates an in-plane AC magnetic field by driving a microwave band AC to the secondary coil (reference number 14 indicates a magnetic recording medium illustrated for reference to clarify positional relationships).

FIG. 15 is a schematic cross-sectional view showing an enlarged view of the vicinity of the ABS and a cross-section that is perpendicular to the track width direction according to another embodiment of a thin film magnetic film of a type that includes a secondary coil between the main magnetic pole and the auxiliary magnetic pole of a magnetic head and generates an in-plane AC magnetic field by driving a microwave band AC to the secondary coil (reference number 14 indicates a magnetic recording medium illustrated for reference to clarify positional relationships).

DETAILED DESCRIPTION OF EMBODIMENTS

A magnetic field measurement apparatus for measuring an in-plane high frequency magnetic field intensity (hereinafter sometimes referred to as an in-plane high frequency magnetic field) generated from a microwave-assisted magnetic head according to the present invention is explained with reference to FIGS. 1-4.

In a strict sense, the in-plane high frequency magnetic field generated from the microwave-assisted magnetic field is generated from a microwave generation mechanism formed in the microwave-assisted magnetic head and is known to be of two types: a self-excited type and an induced type. A configuration of the microwave-assisted magnetic head, which is the subject to be measured, will be discussed later.

Figure 1:
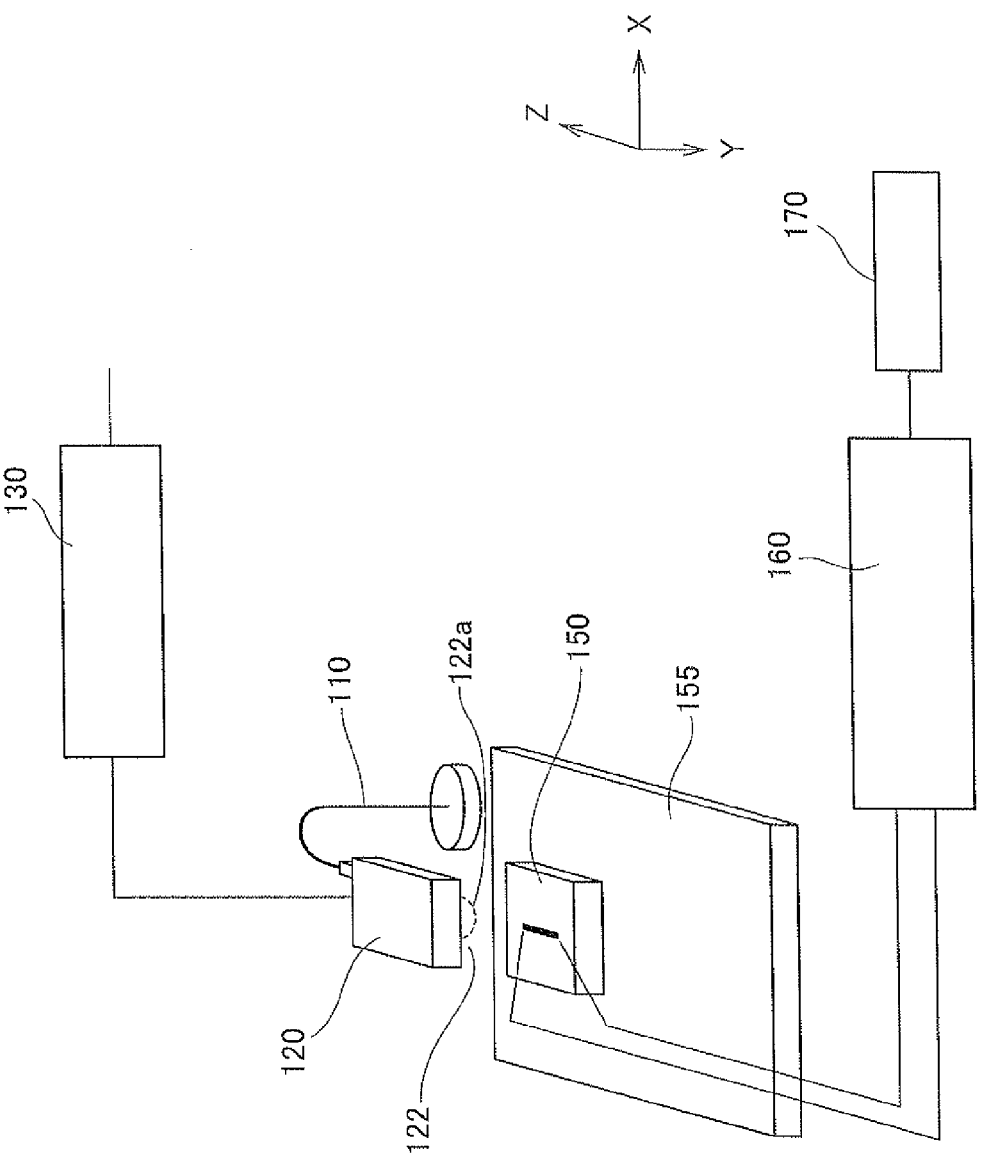
FIG. 1 is a perspective view schematically showing an approximate configuration of a magnetic field measurement apparatus for measuring the in-plane high frequency magnetic field generated from the microwave-assisted magnetic head.
Figure 2:
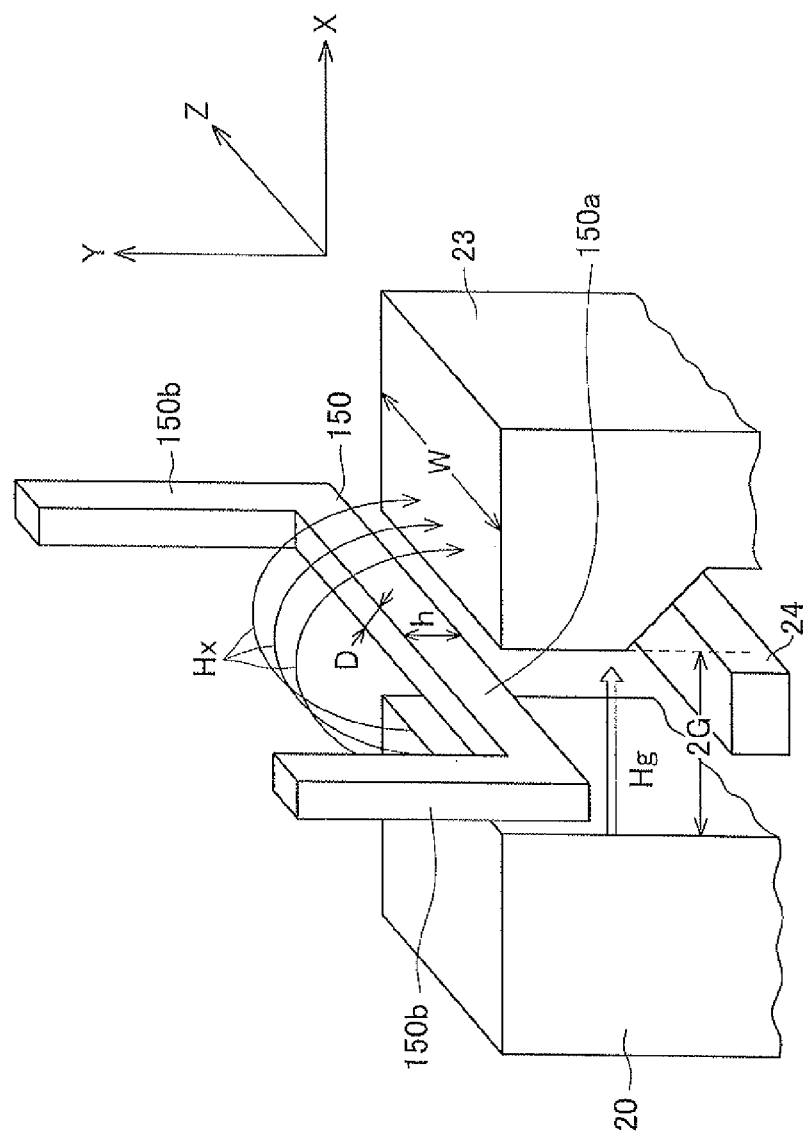
FIG. 2 is a perspective view schematically showing a concept for measuring the in-plane high frequency magnetic field generated from the microwave-assisted magnetic head, using a magnetic field measurement apparatus.

FIG. 1 is a perspective view schematically showing an approximate configuration of a magnetic field measurement apparatus for measuring the in-plane high frequency magnetic field generated from the microwave-assisted magnetic head. FIG. 2 is a perspective view schematically showing a concept for measuring the in-plane high frequency magnetic field generated from the microwave-assisted magnetic head, using a magnetic field measurement apparatus.

Figure 3:
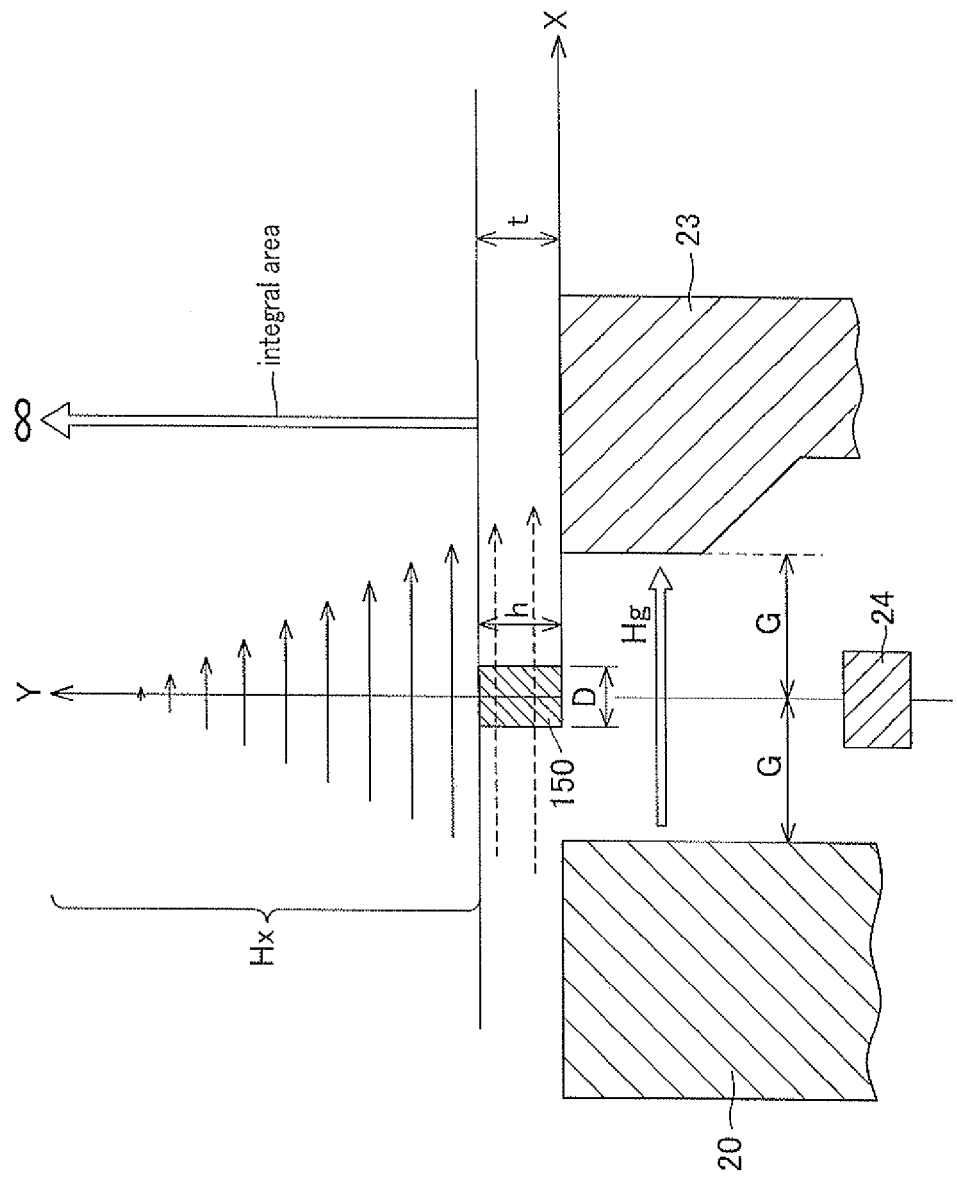
FIG. 3 is a cross-sectional view schematically showing a presence of the in-plane recording magnetic field on the Y axis and schematically showing that an area above a microstrip line is an effective measurement area, when measuring the in-plane high frequency magnetic field that crosses the microstrip line.
Figure 4:
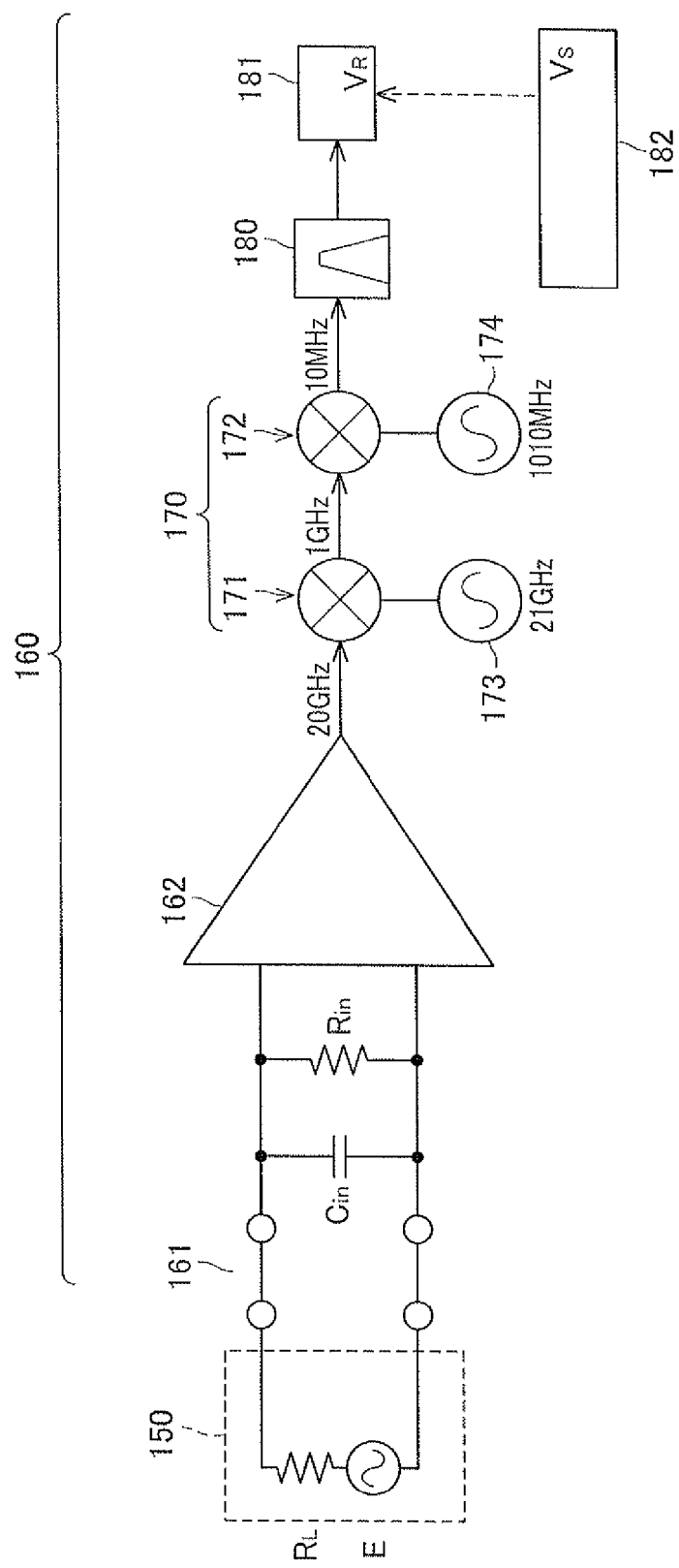
FIG. 4 illustrates a basic configuration of a measurement circuit system connected to the microstrip line or a coplanar wave guide (CPW) that is an in-plane high frequency magnetic field intensity measurement element.

FIG. 3 is a cross-sectional view schematically showing a presence of the in-plane recording magnetic field on the Y axis and schematically showing that an area above a microstrip line is an effective measurement area, when measuring the in-plane high frequency magnetic field that crosses the microstrip line. FIG. 4 illustrates a basic configuration of a measurement circuit system connected to the microstrip line or a coplanar wave guide, which is an in-plane high frequency magnetic field intensity measurement element.

As shown in FIG. 1, the magnetic field measurement apparatus according to the present invention is configured by included a fixing mechanism 110 that holds and fixes a microwave-assisted magnetic head 120, which is the subject to be measured, a high frequency current drive system 130 that applies a high frequency current to a microwave generation mechanism 122 included in the microwave-assisted magnetic head 120, an in-plane high frequency magnetic field intensity measurement element 150 for measuring the intensity of an in-plane high frequency magnetic field 122a generated from the microwave generation mechanism 122, a measurement circuit system 160 connected to the in-plane high frequency magnetic field intensity measurement element 150, and a stage 155 on which the in-plane high frequency magnetic field intensity measurement element 150 is mounted and that is movable three-dimensionally along the X, Y and Z axes. In FIG. 1, the surface plane of the stage 155 corresponds to a Z-X plane, and a direction perpendicular to the plane corresponds to the Y direction.

Each configuration is discussed in detail below.

FIG. 1 shows a stand-type holding device as an example of the fixing mechanism 110 for fixing the microwave-assisted magnetic head. However, this is not particularly limited to this configuration. Significance of the structure of the fixing mechanism 110 is a secure hold without interference of the measurement area so that the in-plane high frequency magnetic field 122a generated from the microwave-assisted magnetic head 120 can be easily measured. In addition, the phrase "holds and fixes" includes a mechanism that fixes the positioning of the microwave-assisted magnetic head by simply mounting it thereon.

Further, the subject microwave-assisted magnetic head 120 held for measurement may be measured as a so-called single element with only the head part or in a state of assembly as a so-called head gimbal assembly.

The microwave generation mechanism 122 included in the magnetic head 120 is formed by various members that include the above-discussed self-excited type or induced type microwave generation element.

Moreover, the in-plane high frequency magnetic field 122a generated from the microwave generation mechanism 122 is primarily generated along the X-Y plane in FIG. 1.

The high frequency current drive system 130 is configured including a system that can supply a predetermined high frequency current so that the in-plane high frequency magnetic field 122a can be generated from the microwave generation mechanism 122.

(Explanation of System for Measuring Intensity of in-Plane High Frequency Magnetic Field 122a)

Next, a system for measuring the intensity of the in-plane high frequency magnetic field 122a generated from the microwave generation mechanism 122 is explained.

The intensity of the in-plane high frequency magnetic field 122a is measured by the in-plane high frequency magnetic field intensity measurement element 150 formed by a microstrip line or a coplanar wave guide (CPW) positioned to oppose the microwave-assisted magnetic head 120.

The element 150 may be configured from only an independent line body or a wafer formed on a dielectric substrate.

The microstrip line or the coplanar wave guide functions to receive the in-plane high frequency magnetic field 122a generated from the subject microwave generation mechanism 122 as a reproduction output voltage by electromagnetic induction. The reception of the reproduction output voltage using the microstrip line or coplanar wave guide can be accomplished relatively easily, and a transmission property to the high frequency region is excellent.

However, the received reproduction output voltage tends to be extremely low. Therefore, in the present invention, the configuration of the measurement circuit system 160 connected to the in-plane high frequency magnetic field intensity measurement element 150 is designed so that a signal-noise ratio (SNR) suitable for practical use can be secured despite the relatively low reproduction output voltage. This configuration is discussed later.

As shown in FIG. 1, the in-plane high frequency magnetic intensity measurement element 150 is mounted on a stage 155 to be three-dimensionally movable in the X, Y and Z axes. As discussed earlier, the surface plane of the stage 155 is the Z-X plane, and a direction perpendicular to the plane is the Y axis.

In FIG. 2, a schematic state is shown where the in-plane high frequency magnetic field generated from the microwave-assisted magnetic head is measured using the microstrip line 150, which is an example of the in-plane high frequency magnetic field intensity measurement element 150.

As shown in FIG. 2, a secondary coil 24 for driving a microwave band AC is positioned in a recording gap formed by a main magnetic pole 20 and an auxiliary magnetic pole 23. The microstrip line 150 is positioned along a center line of a recording gap to oppose the secondary coil 24 to measure an in-plane high frequency magnetic field Hx generated from the secondary coil 24 for assisting the recording.

The microstrip line 150 shown in FIG. 2 as an example has a so-called U-shape formed by a main straight part 150a and side straight parts 150b formed at both ends of the main straight part 150a. The microstrip line 150 may be formed from only a linear conductor as shown in the figure or a conductor patterned on a dielectric substrate.

As shown in FIG. 2, electromagnetic induction occurs based on the in-plane high frequency magnetic field existing at a position that crosses over the main straight part 150a, which is a center line part of the microstrip line 150. The reproduction output voltage is received from the side straight parts 150b of the microstrip line and is transmitted to the measurement circuit system 160.

In FIG. 2, symbol h refers to a height of the main straight part 150a, which is a center line part of the microstrip line 150, in the Y direction. Symbol D refers to a width of the main straight part 150a, which is a center line part of the microstrip line 150, in the X direction. The Y direction refers to the height, and the X direction is a lamination direction as well as a length direction. Symbol Hg refers to a gap magnetic field. Symbol G refers to a half gap length (2G: gap length), and symbol W refers to a width of the magnetic pole.

The gap length (2G) is approximately 30 nm, for example. A length of the main straight part 150a of the microstrip line is approximately 100 nm, for example. The width D of the microstrip line is approximately 15 nm, for example. The height h is approximately 15 nm, for example. A cross-sectional area $S_0$ of the microstrip line is determined by multiplying D with h. The side straight parts 150b of the microstrip line 150 generally have a similar cross-sectional area $S_0$.

FIG. 3 is a cross-sectional view in the Y-Z plane shown in FIG. 2 and schematically shows a distribution state of the in-plane high frequency magnetic field Hx on the Y axis when measuring the in-plane high frequency magnetic field that crosses over the microstrip line 150. An area above a top end of the microstrip line 150 is the area where the in-plane high frequency magnetic wave Hx is effectively measured.

In FIG. 3, a part of the in-plane high frequency magnetic field Hx excited by the secondary coil 24 of the microwave-assisted magnetic head crosses over the microstrip line 150. A total magnetic flux Hx in an integral area (integral area in FIG. 3) for the crossing is converted into a reproduction voltage (induction voltage) using a law of electromagnetic induction. Integration is needed throughout the integral area (integral area in FIG. 3) to determine a total magnetic flux amount of the in-plane high frequency magnetic field crossing over the microstrip line 150.

As a result of devoted research by the inventors, the reproduction voltage (induction voltage) can be calculated by an integration function using, as parameters, vacuum permeability $\mu_0$, a gap magnetic field Hg, a magnetic pole width w, the half gap length G, a drive frequency f, and the like.

As understood from FIG. 3, the microstrip line 150 may be placed at a position closest to the magnetic pole and can perform the measurement directly. Therefore, sensitivity for the in-plane high frequency magnetic field Hx is high regardless of its minute scale.

Moreover, the reproduction sensitivity can be increased by the configuration of a cross-sectional formation of the microstrip line 150. That is, the reproduction sensitivity tends to increase if a resistance of the microstrip line 150 can be decreased by increasing the cross-sectional area $S_0$ (S=D×h; see FIGS. 2 and 3) of the microstrip line 150. This is because noise is decreased. In addition, the reproduction sensitivity tends to increase if the width D is configured to be larger and the height h is configured to be smaller, despite the same cross-sectional area $S_0$ for the microstrip line 150. This is because the integral area of the in-plane recording magnetic field on the Y axis shown in FIG. 3 increases. The width D is approximately 10-20 nm, for example, and the height h is approximately 10-20 nm, for example.

Figure 5:
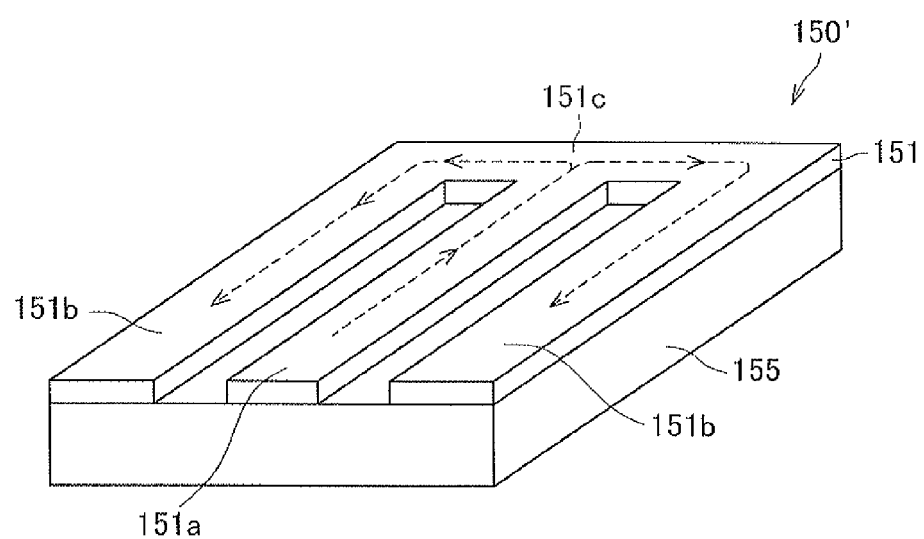
FIG. 5 is a perspective view schematically showing a formation of the coplanar wave guide.

Furthermore, instead of the microstrip line 150, a coplanar wave guide (CPW) as shown in FIG. 5 may be used. The coplanar wave guide 150' shown in FIG. 5 is formed by a E-shaped conductor 151 formed on the dielectric substrate 155.

The E-shaped conductor 151 is a so-called short circuited type, which includes a center line part (central conductor) 151a in the middle, side line parts (side conductors) 151b located on both sides of the center line part 151a, and a single-side end (short circuit part) 151c that provides a connection to form the E-shape. The center line part 151a in the middle is arranged to be positioned along a center line of the gap between the main magnetic pole and the auxiliary magnetic pole of the microwave-assisted head. The reproduction output at the center line part 151a in the middle is similar to the microstrip line. As shown with dotted lines, the electromagnetic wave (electric current) generated from the electromagnetic induction at the center line part (central conductor) 151a in the middle flows to the side line parts 151b after being divided at the short circuit part 151c. Therefore, it is also possible to increase the SNR by differential output.

Figure 6:
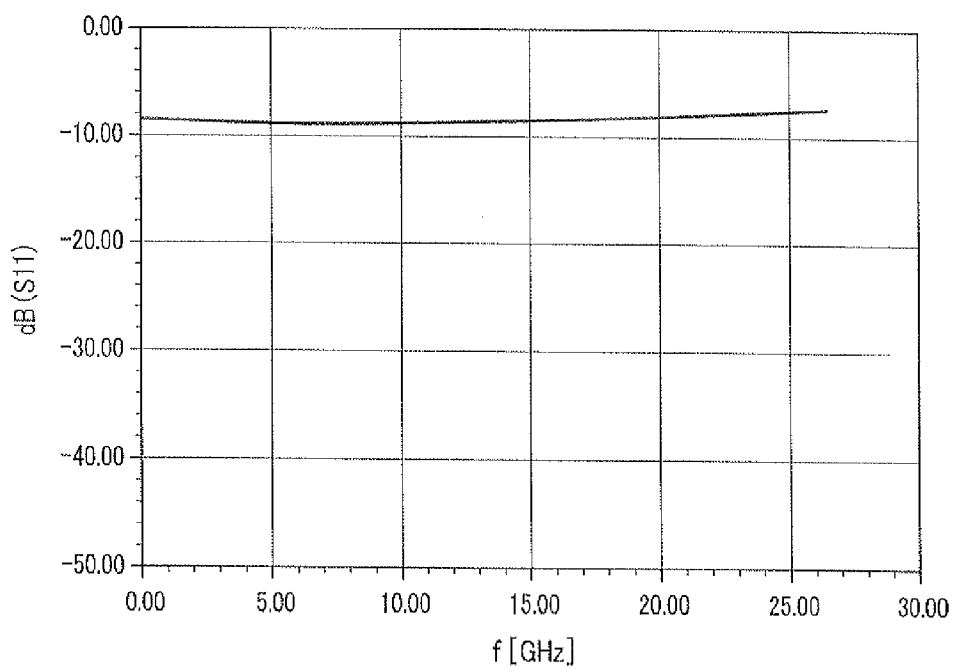
FIG. 6 is a graph in which a reflection coefficient S11 (dB), which is a transmission property, is determined for frequencies when using the coplanar wave guide.

FIG. 6 shows a graph in which a reflection coefficient S11 (dB), which is the transmission property, is determined for frequencies when using the coplanar wave guide 150' (Au being used as the conductor) shown in FIG. 5. From the results shown in the graph in FIG. 6, the reflection coefficient S11 shows a substantially flat transmission property up to a wideband range of 10 GHz and further up to 25 GHz. Therefore, it is understood that the transmission property does not degrade, that is, the high frequency property does not degrade, even to a high frequency region.

It has been confirmed that the reflection coefficient S11 for the microstrip line also shows a substantially flat transmission property similar to the graph shown in FIG. 6.

For operation to detect the magnetic field, because a distance in the Y direction (proximity distance between the element and the head) may be fixed as configured in advance for certain degrees, a magnetic field intensity profile can be determined by scanning in the X-Z direction.

The mechanism for three-dimensional movement on the X, Y and Z axes may perform a minute movement in the X, Y and Z directions using a micro drive element utilizing various piezoelectric bodies, for example.

The in-plane high frequency magnetic field intensity measurement element 150 that includes the microstrip line or the coplanar wave guide as its main part is connected to the measurement circuit system 160.

As shown in FIG. 4, the measurement circuit system 160 according to the present invention includes a transmission path 161, an amplifier 162, a mixer circuit 170, a band-pass filter 180, and a reproduction voltage measurement part (reproduction output measurement part) 181, connected in order from the output end side of the in-plane high frequency magnetic field intensity measurement element 150. A comparator 182 for determining a quality is connected at the end.

The measurement circuit system 160 according to the present invention is configured such that a signal-noise ratio (SNR), which is a ratio of a reproduction voltage (reproduction output) S of the high frequency reproduction signal included at the in-plane high frequency magnetic field intensity measurement element 150 and a total noise N of the circuit including the noise generated by the in-plane high frequency magnetic field intensity measurement element 150, becomes equal to or greater than 3 dB. Especially, because detection errors are caused if the SNR is small, 3 dB or greater is needed.

In particular, the measurement circuit system 160 of the present invention is configured to increase the SNR for the high frequency reproduction output that the microstrip line or the like generates.

Below are the detailed descriptions of the measurement circuit system 160.

For the in-plane high frequency magnetic field intensity measurement element 150 (microstrip line or coplanar wave guide) indicated by a dotted line on the left side of FIG. 4, E indicates a reproduction output voltage by electromagnetic induction, and $R_L$, indicates line resistance of the element 150. $C_{in}$ indicates input capacitance for the amplifier 162, and $R_{in}$ indicates input resistance for the amplifier 162.

The fundamental frequencies for the high frequency wave that the in-plane high frequency magnetic field intensity measurement element 150 receives are 10-40 GHz. This frequency range originates from matching the ferromagnetic resonance frequency of the magnetic recording film, which is subjected to recording, and the frequency bandwidth generated by the microwave-assisted magnetic head, which is the subject to be measured. In FIG. 4, 20 GHz is selected from the fundamental frequency of 10-40 GHz.

The voltage signal detected by the in-plane high frequency magnetic field intensity measurement element 150 is transmitted to the amplifier 162 through the transmission path 161. The amplifier 162 may be formed from a pre-amplifier and a main-amplifier or may be formed from only the main-amplifier.

The reproduction output voltage by the electromagnetic induction at 20 GHz, for example, which is outputted from the in-plane high frequency magnetic field intensity measurement element 150, such as a microstrip line, is inputted to the mixer circuit (multiplication circuit) 170 after being amplified by the amplifier 162.

The mixer circuit 170 shown in FIG. 4 is a two-step circuit, for example, including a first mixer circuit 171 and a second mixer circuit 172. However, it is not limited to the two-step circuit but may include three or more steps or may include only a single step.

For the first mixer circuit 171 shown in FIG. 4, a 21-GHz oscillation is produced by a first local oscillation circuit 173. The 21-GHz output is inputted to the first mixer circuit 171 and mixed with the 20-GHz signal.

The operation of the mixer circuit is to obtain an addition signal and a difference signal of the input signal (in this case 20 GHz) and a signal frequency from the local oscillator (in this case 21 GHz). That is, at the first mixer circuit 171:

the addition signal is as follows:

Addition signal=21 GHz+20 GHz=41 GHz the difference signal is as follows:

Difference signal=21 GHz−20 GHz=1 GHz

In the present invention, because the object is to down-convert the signal(s), a signal at 1 GHz (1000 MHz), which is the difference signal, is obtained by the first mixer circuit 171 at the first step. The obtained signal is further down-converted by the second mixer circuit 172 at the second step, and the center frequency is reduced to 10 MHz.

In other words, for the second mixer circuit 172 shown in FIG. 4, a 1010-MHz oscillation is produced by a second local oscillation circuit 174. The 1010-MHz output is inputted to the second mixer circuit 172 and mixed with the 1000-MHz (1-GHz) signal. That is, at the second mixer circuit 172, the addition signal is formed as follows:

Addition signal=1010 MHz+1000 MHz=2010 MHz the difference signal is formed as follows:

Difference signal=1010 MHz−1000 MHz=10 MHz

As discussed above, because the object of the present invention is to down-convert the signal(s), a signal at 10 MHz, which is the difference signal, is obtained as a center frequency by the second mixer circuit 172 at the second step.

The 10-MHz signal that has been finally down-converted by the mixer circuit 170 is a short-wavelength region, and a band-pass filter of approximately 3 KHz has been practically used for this frequency.

In the present invention, the uniqueness is that the fundamental frequency that is immediately before being inputted to the band-pass filter 180 connected to the mixer circuit 170 as a subsequent process is down-converted by the mixer circuit 170 to a frequency at a level where the narrow bandwidth (detailed bandwidth is discussed below) of the band-pass filter 180 can be used, so that 3 dB or more can be obtained for the so-called SNR.

Concerning the detailed value, a peak passing frequency (basis frequency) that is down-converted by the mixer circuit 170 is set in a range of 5-20 MHz, and preferably 8-12 MHz. If the value exceeds the upper limit value or decreases below the lower limit value, it tends to be difficult to make the SNR equal to or greater than 3 dB as a result of cooperation with the narrow bandwidth band-pass filter connected after the mixer circuit.

The band-pass filter 180 connected following the mixer circuit 170 is a band-pass filter that has a narrow bandwidth of ±0.5-±10 KHz, and more preferably ±1.5-±5 KHz (bandwidth of 3 KHz-10 KHz), the bandwidth being centered around the above-discussed based frequency, which has been down-converted by the mixer circuit 170.

If the bandwidth exceeds the upper limit value or decreases below the lower limit value, it tends to be difficult to make the SNR equal to or greater than 3 dB as a result of cooperation with the above-discussed fundamental frequency that was down-converted by the preceding mixer circuit 170.

Principally, the SNR increases when the bandwidth is small. However, if the bandwidth is too small, the advantage of the center frequency may tend to decrease, or a waveform deformation may tend to occur.

Through such band-pass filter 180, a reproduction voltage $V_R$ can be determined by the reproduction voltage measurement part 181.

The reproduction voltage $V_R$ obtained through the filter of the measurement circuit system 160 and a standard voltage $V_S$ are compared at the comparator 182. If the reproduction voltage $V_R$ is greater than the standard voltage $V_S$, the product quality is determined to be acceptable.

The measurement operation at the magnetic field measurement apparatus is accomplished as described below.

The in-plane high frequency magnetic field intensity measurement element 150 (microstrip line or coplanar wave guide) mounted on the stage 155 is positioned to oppose the ABS (i.e., opposing surface of the magnetic recording medium) of the microwave-assisted magnetic head 120 fixed by the fixing mechanism. A magnetic intensity profile is determined by generating the in-plane high frequency magnetic field 122a from the microwave generation mechanism 122 by applying a high frequency current from the high frequency current drive system 130 to the microwave generation mechanism 122 installed in the microwave-assisted magnetic head 120. The magnetic intensity profile is determined further by scanning a predetermined area of the ABS using the in-plane high frequency magnetic field intensity measurement element 150 (microstrip line or coplanar wave guide) by moving the stage, and by detecting the in-plane high frequency magnetic field intensity from the microwave-assisted magnetic head using the in-plane high frequency magnetic field intensity measurement element 150.

(Description of Microwave-Assisted Magnetic Head Subject for Measurement by Magnetic Field Measurement Apparatus of Present Invention)

Next, a configuration of the microwave-assisted magnetic head that is the subject to be measured by the magnetic field measurement apparatus of the present invention is explained.

As discussed above, the microwave-assisted magnetic head may be classified as a self-excited type and an induced type.

First, a preferred example of the induced type is explained with reference to FIGS. 7-10.

(Explanation of Example of Induced Type Microwave-Assisted Magnetic Head)

Figure 7:
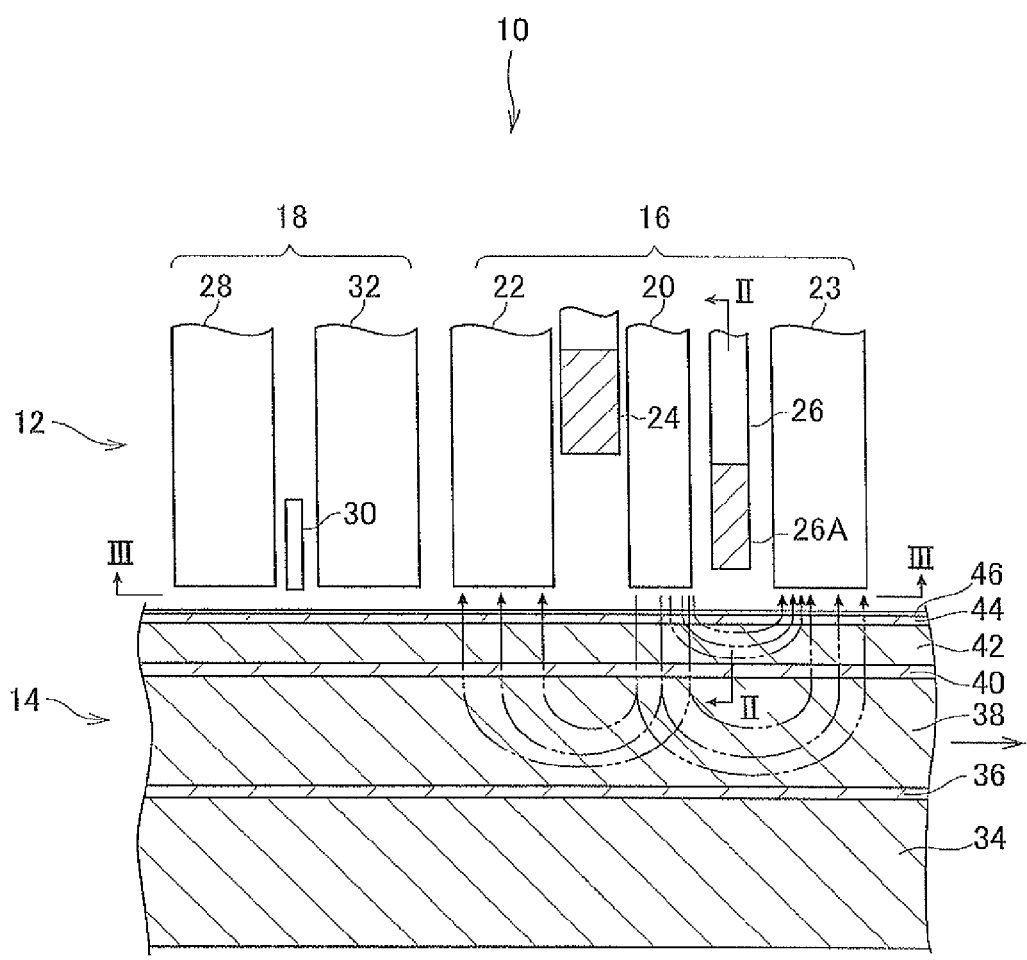
FIG. 7 is a schematic cross-sectional view showing a cross-section that is perpendicular to a track width direction, of a thin film magnetic head that includes a secondary coil between a main magnetic pole and an auxiliary magnetic pole of the magnetic head and that is of a type that generates the in-plane AC magnetic field by driving a microwave band AC to the secondary coil, and a magnetic recording medium.

As shown in FIG. 7, a thin film magnetic head 12 includes a recording head 16 and a reproduction head 18. A magnetic recording medium 14 is provided to oppose the thin film magnetic head.

The recording head 16 is formed by a main magnetic pole 20, a front shield (auxiliary magnetic pole) 22 positioned at a front end on the recording side, a rear shield (auxiliary magnetic pole) 23 positioned at a rear end on the recording side, a primary coil 24 for generating a perpendicular recording magnetic field at the main magnetic pole 20, and a secondary coil 26 for generating an in-plane AC magnetic field at the main magnetic pole 20. The recording head 16 is configured such that the maximum value of the in-plane AC magnetic field is smaller than the maximum value of the perpendicular recording magnetic field.

The perpendicular recording magnetic field means a magnetic field applied in a direction substantially perpendicular to a lamination surface of a recording layer 42 of the magnetic recording medium 14 (up-down direction in the figure). In addition, the in-plane AC magnetic field means a magnetic field applied in a direction substantially parallel with a top surface of the lamination surface of the recording layer 42.

Figure 8:
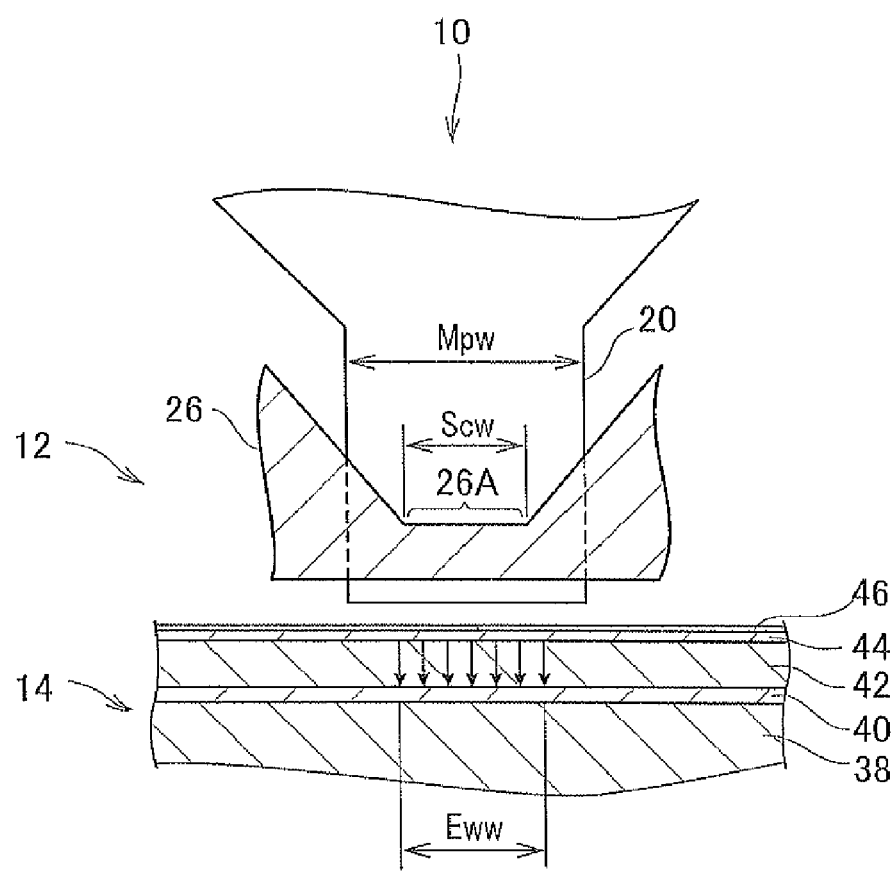
FIG. 8 is a cross-sectional view along a line II-II in FIG. 7.

As shown in FIG. 8, a front end part of the main magnetic pole 20 adjacent to the magnetic recording medium 14 is narrower than a base part side as seen from a side of the front shield 22 or the rear shield 23. A width of the front end part is illustrated as Mpw in the drawing. With such a configuration, a writing magnetic flux can be focused.

Figure 9:
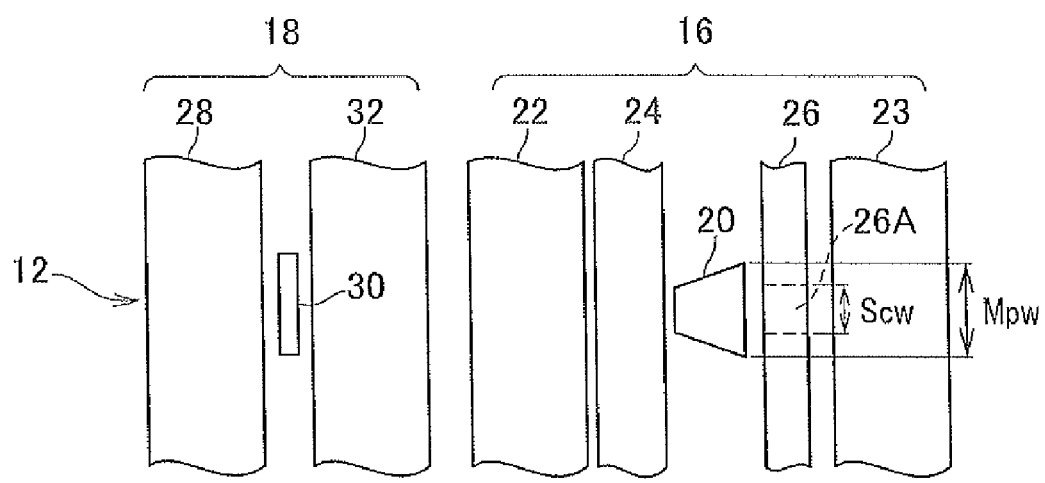
FIG. 9 illustrates a medium opposing surface of a thin film head seen from a direction of an arrow along a line III-III in FIG. 7.

FIG. 9 is a bottom view, which shows the so-called ABS, of the thin film magnetic head seen from a side of the magnetic recording medium 14. As shown in FIG. 9, the front end of the main magnetic pole 20 has an approximately trapezoidal shape that narrows down from the side of the rear shield 23 towards the front shield 22. The maximum width of the main magnetic pole 20, which is indicated by Mpw, is a width of a surface that opposes the rear shield 23 (maximum width of the trapezoid).

Compared to the width Mpw of the front end of the main magnetic pole 20, widths of the front shield 22 and the rear shield 23 are configured to be significantly larger. Although not shown in the drawing, the front shield 22 and the rear shield 23 are connected to the base end of the main magnetic pole 20.

To make the direction of the perpendicular recording magnetic field applied to the recording layer 42 close to the direction perpendicular to the surface of the magnetic recording medium 14, a gap between the main magnetic pole 20 and the front shield 22 is preferably equal to or greater than 1 µm. In addition, a gap between the main magnetic pole 20 and the rear shield 23 is preferably 10-100 nm, and more preferably approximately 50 nm.

The primary coil 24 is arranged at the main magnetic pole 20 on the side of the front shield 22 to surround the connecting part (not shown) between the main magnetic pole 20 and the front shield 22. FIG. 7 shows an example of a single turn of the primary coil 24. However, it is not limited to this, and there may be two or more turns. In addition, in FIG. 7, the primary coil 24 is a single layer but may include multiple layers.

The secondary coil 26 is arranged at the main magnetic pole 20 on the side of the rear shield 23 to surround the connecting part (not shown) between the main magnetic pole 20 and the rear shield 23. As shown in the drawing, a part of the secondary coil 26 is arranged between the main magnetic pole 20 and the rear shield 23. A thickness of the secondary coil 26 is preferably 10-50 nm.

In general, the edge of the main magnetic pole 20, which is the magnetic recording medium opposing surface, is grounded in the head manufacturing process. Therefore, to avoid the secondary coil 26 from being grounded, the edge of the secondary coil 26 is preferably drawn back in a direction away from the magnetic recording medium 14 by approximately 10 nm or greater from the edge of the main magnetic pole 20.

The secondary coil 26 includes an AC magnetic current transmission part 26A at a position opposing the magnetic recording medium 14. In other words, the AC magnetic field transmission part 26A has a substantially constant cross-sectional shape that is perpendicular to the width direction as shown in FIG. 7. Moreover, as shown in FIG. 8, the AC magnetic field transmission part 26A is formed approximately parallel with the width direction, and the cross-sectional area thereof is configured to be smaller than other parts of the secondary coil 26.

Further, as shown in FIG. 8, a width Scw of the AC magnetic field transmission part 26A of the secondary coil 26 is preferably configured to be smaller than the width Mpw of the front end of the main magnetic pole 20.

In FIG. 7, the second coil 26 has a single turn. However, the number of turns is not limited particularly and may be two or more. In addition, in FIG. 7, the secondary coil 26 has a single layer. However, it is not limited to this and may be a multilayer including two or more layers being stacked. By increasing the number of turns or the number of layers for the secondary coil 26, the in-plane AC magnetic field can be increased while suppressing the current supplied to the secondary coil 26.

An example is shown, in which the secondary coil is arranged between the main magnetic pole 20 and the rear shield 23. However, a plurality of thick coils having a size of approximately a few μm may be arranged at a position further away from the ABS.

The coil may have a single or multiple turns. As a result, a large drive current can be applied, and a recording magnetomotive force (motivated magnetic field) can be increased. FIGS. 12-15, for example, show their detailed formations.

Figure 12:
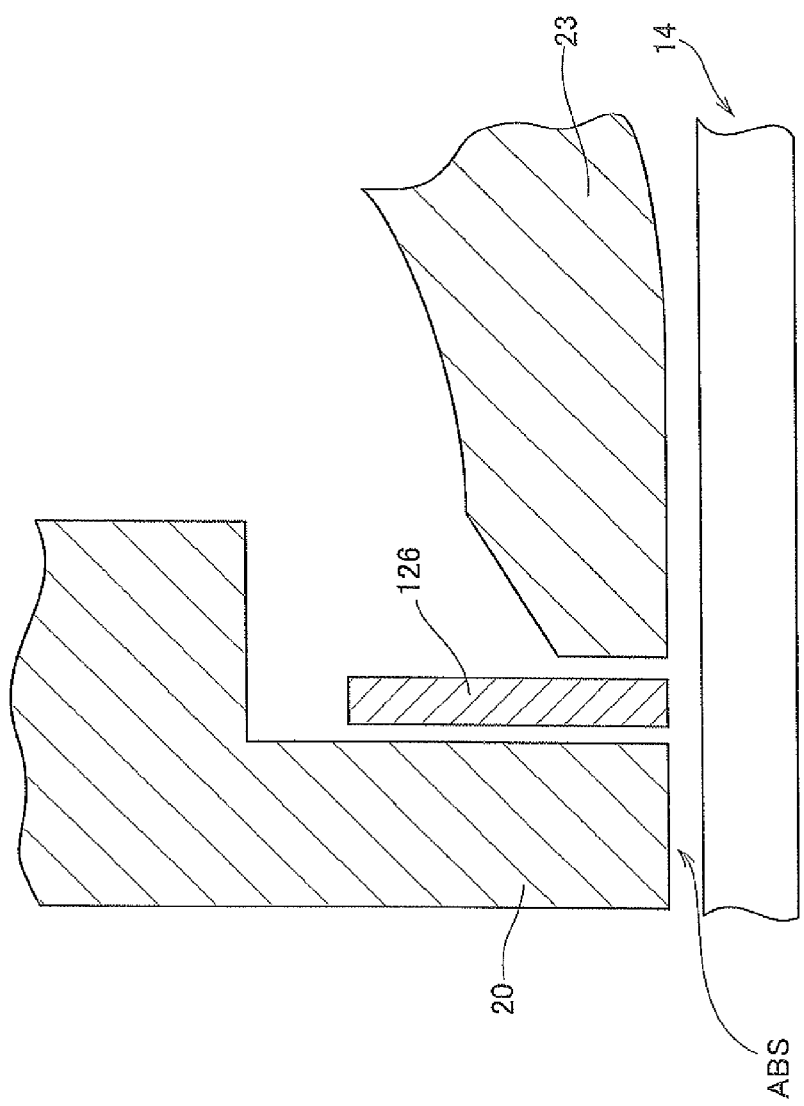
FIG. 12 is a schematic cross-sectional view showing an enlarged view of the vicinity of an air bearing surface (ABS) and a cross-section that is perpendicular to the track width direction according to another embodiment of a thin film magnetic film of a type that includes a secondary coil between the main magnetic pole and the auxiliary magnetic pole of a magnetic head and generates an in-plane AC magnetic field by driving a microwave band AC to the secondary coil (reference number 14 indicates a magnetic recording medium illustrated for reference to clarify positional relationships).

FIG. 12 is a schematic cross-sectional view showing an enlarged view of the vicinity of the ABS and a cross-section that is perpendicular to the track width direction according to another embodiment of a thin film magnetic film of a type that includes a secondary coil between the main magnetic pole 20 and the auxiliary magnetic pole 23 of a magnetic head and generates an in-plane AC magnetic field by driving a microwave band AC to the secondary coil (reference number 14 indicates a magnetic recording medium illustrated for reference to clarify positional relationships).

An edge shape of the main magnetic pole 20 and the auxiliary magnetic pole 23 of the magnetic head near the ABS form an extremely narrow gap therebetween as shown in FIG. 12. An auxiliary coil 126 arranged in this small space is provided in a shape that extends to a interior side, which is a direction opposite from the ABS. The ABS side of the auxiliary coil 126 is configured approximately at the same position as the edge of the main magnetic pole 20 and the auxiliary magnetic pole 23. Further, a length of the auxiliary coil 126 in the track width direction is equal to or greater than a length of the edge part of the main pole 20 in the track width direction.

With such configuration, a large drive current can be applied to increase the recording magnetomotive force (motivated magnetic field).

A feature of a preferred modification of an auxiliary coil 226 shown in FIG. 13 is that the auxiliary coil shown in FIG. 12 is divided into three coils 226a, 226b and 226c and that the divided coils are connected in parallel with each other. With such a configuration, a large drive current can be applied to increase the recording magnetomotive force (motivated magnetic field).

A feature of a preferred modification of an auxiliary coil 326 shown in FIG. 14 is that an auxiliary coil 326a is formed on the side of the ABS and that a thicker auxiliary coil 326b is formed on the interior side (opposite side from the ABS). In addition, the length of the auxiliary coils 326a and 326b in the track width direction is equal to or greater than the length of the edge part of the main magnetic pole 20 in the track width direction. With such a configuration, a large drive current can be applied to increase the recording magnetomotive force (motivated magnetic field).

A feature of a preferred modification of an auxiliary coil 426 shown in FIG. 15 is that two thick auxiliary coils 426a and 426b are formed in order on the interior side away from the ABS. In addition, the length of the auxiliary coils 426a and 426b in the track width direction is equal to or greater than the length of the edge part of the main magnetic pole 20 in the track width direction. With such configuration, a large drive current can be applied to increase the recording magnetomotive force (motivated magnetic field).

The preferred modification of each auxiliary coil is as discussed above. However, they are not necessarily limited to such configurations.

Figure 10:
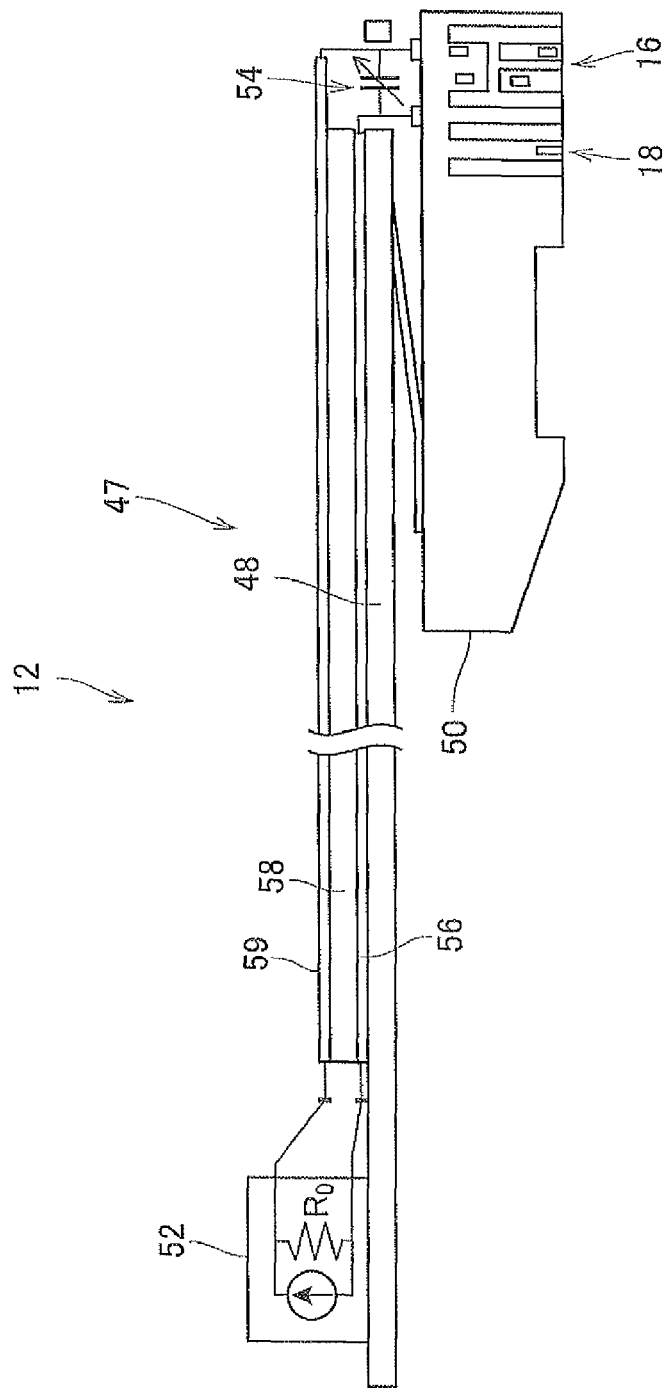
FIG. 10 illustrates a schematic configuration of a head gimbal assembly that includes a secondary coil drive part, a variable capacitor and a suspension arm.

As shown in FIG. 10, the thin film magnetic head 12 includes a secondary coil electric circuit 47 (including the secondary coil 26) for supplying the AC to the secondary coil 26. The thin film magnetic head 12 includes a suspension arm 48 and a slider 50 mounted on the front end thereof. The recording head 16 and the reproduction head 18 are formed on the slider 50.

As shown in FIG. 10, the secondary coil electric circuit 47 includes a second coil drive part 52 near a base end of the suspension arm 48 for supplying to the secondary coil 26 the AC at a microwave band frequency in a range of 10-40 GHz. Above the suspension arm 48, a conductive layer 56, an insulation layer 58 and a conductive layer 59 are laminated in order. The secondary coil drive part 52 is electrically connected to the secondary coil 26 through the conductive layers 56 and 59 that form a flat wave guide.

The secondary coil electric circuit 47 shown in FIG. 10 includes a variable capacitor (impedance adjustment element) 54 near the slider 50. A resonance frequency of the secondary coil electric circuit 47 is preferably close to the ferromagnetic resonance frequency of the recording layer 42 of the magnetic recording medium 14.

In FIG. 7, the recording head 18 includes a front shield 28, a magnetoresistive effect element 30 and a rear shield 32.

In FIG. 7, the magnetic recording medium 14 is formed by stacking, in order, a substrate 34, a base layer 36, a soft magnetic layer 38, an alignment layer 40, a recording layer 42, a protective layer 44 and a lubricating layer 46, for example. A material of the recording layer 42 preferably has perpendicular magnetic anisotropic energy of $1 \times 10^6$ erg/cc or more. As a specific material for the recording layer 42, a CoCrPt alloy, for example, may be used. The ferromagnetic resonance frequency of the recording layer 42 is a material-dependent value that is determined by a shape, constituent element and the like of magnetic particles forming the recording layer 42. The magnetic recording medium 14 is mounted on a rotation mechanism (not shown) to rotate in a direction of the arrow shown in FIG. 7 (a direction to the right-hand side of FIG. 7).

Operation of such thin film magnetic head 12, in particular the recording head 16, is discussed below.

That is, the primary coil 24 of the recording head 16 generates a direct current (DC) magnetic field by supplying DC electricity to the primary coil 24. The DC magnetic field refluxes through the main magnetic pole 20, the soft magnetic layer 38 of the magnetic recording medium 14, the front shield 22 and the rear shield 23. The perpendicular recording magnetic field in the direction perpendicular to the surface of the magnetic recording medium 14 is applied to the recording layer 42.

On the other hand, the secondary coil 26 generates the AC magnetic field when the secondary coil electric circuit 47 supplies the microwave band AC at the frequency in a range of 10-40 GHz to the secondary coil 26. The AC magnetic field is transmitted to the main magnetic pole 20 and the rear shield 23 mainly from the AC magnetic transmission part 26A. Because this AC magnetic field is a high frequency wave, the AC magnetic field is transmitted through the main magnetic pole 20 and the rear shield 23, due to the skin effect, only at portions of the main magnetic pole 20 and the rear shield 23 near a part of the surfaces that face the AC magnetic transmission part 26A.

The AC magnetic field that the secondary coil 26 generates is generated only at a small part of the main magnetic pole 20 and the rear shield 23 where the gap therebetween is small. However, the AC magnetic current reaches the deepest part of the magnetic medium 14. That is, the AC magnetic field that the secondary coil 26 generates flows through the main magnetic main pole 20, the recording layer 42 and the rear shield 23 to be transmitted through the recording layer 42 in a direction substantially parallel with the surface of the magnetic recording medium 14.

By applying the in-plane AC magnetic field having a microwave band frequency to the recording layer 42, the recording magnetic field in the perpendicular direction that is required for the perpendicular magnetic recording can be significantly reduced. For example, in a comparison with a case where the in-plane AC magnetic field is not applied, the perpendicular magnetic field that can reverse the magnetization of the recording layer 42 can be reduced by approximately 40% or more, and up to approximately 60%, by applying the in-plane AC magnetic field.

(Explanation of Example of Self-Excited Type Microwave-Assisted Magnetic Head)

Next, a preferred example of a self-excited type microwave-assisted magnetic head is briefly explained with reference to FIG. 11.

Figure 11:
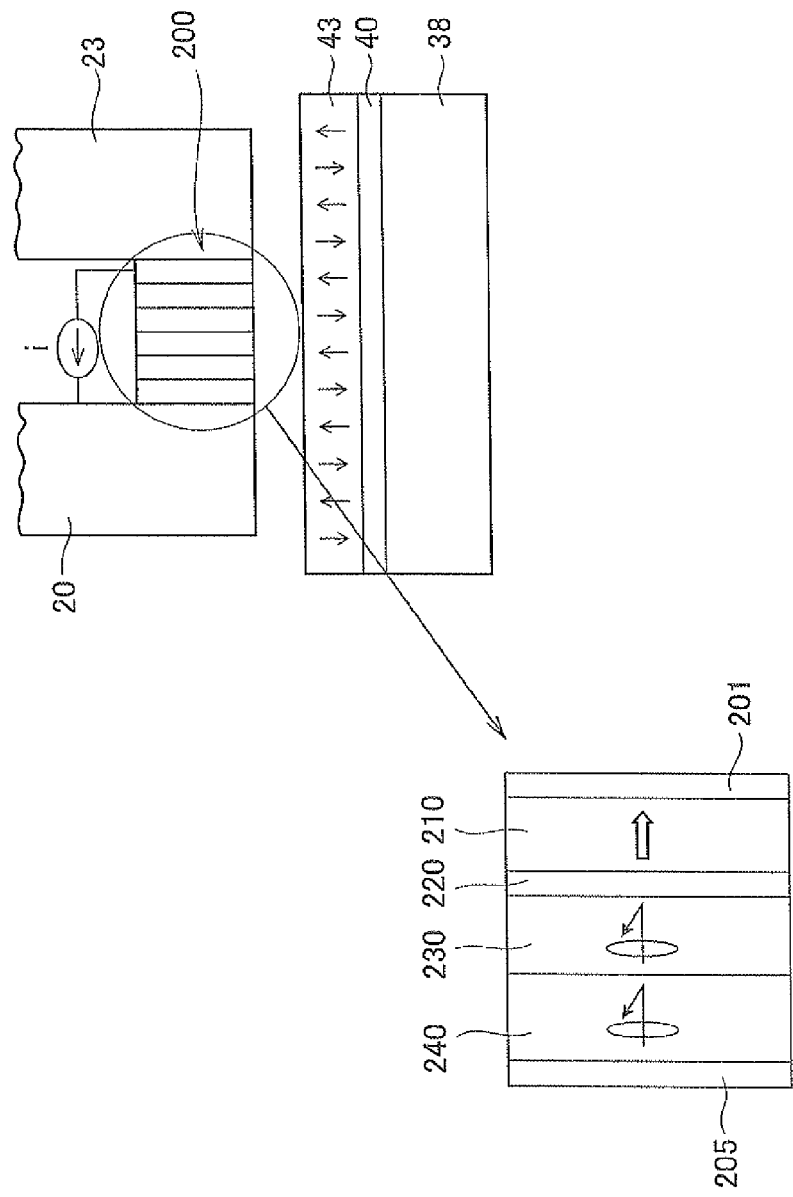
FIG. 11 is a schematic cross-sectional view showing a perpendicular cross-section, with respect to a track width direction, of a thin film magnetic head that forms a spin torque oscillator (STO) formed of a multilayer magnetic thin film in a gap between the main magnetic pole and the auxiliary magnetic pole of the magnetic head, and a magnetic recording medium.

FIG. 11 illustrates a relevant part of the self-excited type microwave-assisted recording in a basic configuration. This formation is disclosed in IEEE Transactions on Magnetics, Vol. 44, No. 1, January 2008, pp. 125-131.

The self-excited type microwave-assisted magnetic head is formed by inserting a microwave generation element 200 having a configuration similar to a magnetoresistive effect element (MR element), such as a tunnel magnetoresistive effect element (TMR element) or a current-perpendicular-to-plane giant magnetoresistive effect element (CPP-GMR element), between the main magnetic pole and a trailing shield (synonym with auxiliary magnetic pole) in a normal recording head structure.

The magnetic recording medium 14 is shown by simplifying the above-discussed configuration shown in FIG. 7 and only the soft magnetic layer 38, the alignment layer 40 and the recording layer 42 are disclosed in FIG. 11. However, the actual configuration may be similar to the configuration shown in FIG. 7.

As shown in FIG. 11, the microwave generation element 200 provided between the main magnetic pole 20 and the auxiliary magnetic pole 23 has a structure, as shown in detail in an enlarged view of the relevant part, in which a reference layer 210, a metallic interlayer 220, a high saturation moment field generating layer 230, and a layer with perpendicular anisotropy 240, which are magnetically pinned in the perpendicular direction, are laminated in order, and in which electrodes 210 and 205 are provided on the side surfaces of the laminated body.

The high saturation moment field generating layer 230 and the layer with perpendicular anisotropy 240 are magnetically exchange-coupled with each other to form an oscillating stack.

By applying an electric current for exciting a spin wave from a side of the reference layer 210 to a side of the oscillating stack, perpendicularly polarized spins are transmitted from the side of the reference layer 210 to the oscillating stack (the high saturation moment field generating layer 230 and the layer with perpendicular anisotropy 240) through the metallic interlayer 220. By precession movement by the oscillating stack, microwaves are oscillated to generate a high frequency magnetic field.

The generated high frequency magnetic field includes a high frequency magnetic field component in an in-layer plane direction of the perpendicular magnetization layer, at a position of the perpendicular magnetization layer of the magnetic recording medium (magnetic disk). By irradiating the high frequency magnetic field at a part of the perpendicular magnetization layer, the anisotropic magnetic field Hk of the irradiated part can be decreased. The anisotropic magnetic field Hk is a physical quantity that provides a coercive force Hc. When a writing magnetic field is applied from the edge of the main magnetic pole 20 to the part at which the anisotropic magnetic field Hk has been lowered, the writing can be performed at a perpendicular magnetization layer having an extremely large anisotropic magnetic field Hk, and the so-called microwave-assisted magnetic recording can be achieved well.

The frequency of the high frequency magnetic field generated from the oscillating stack that forms the above-discussed microwave oscillation element may be formed to be substantially equivalent with the magnetic resonance frequency of the magnetic recording layer of the magnetic recording medium subjected to writing.

Embodiment

The invention of a device that measures intensity of the in-plane high frequency magnetic field generated from the above-discussed microwave-assisted magnetic head is discussed in further detail using the following example of a specific experiment.

First Example of Experiment

Comparative Example

In the measurement circuit system 160 as shown in FIG. 4, the mixer circuit 170 was removed from the measurement circuit system 160. Then, the drive frequency was not down-converted but maintained at 20 GHz. In addition, the bandwidth of the band-pass filter 180 was set to 1 GHz. The microstrip line 150 as shown in FIGS. 2 and 3 were used as the in-plane high frequency magnetic field intensity measurement element 150.

The specification of the microstrip line 150 used is as discussed below.

<Specification of Microstrip Line>

The width (D) and the height (h) of the microstrip line were set to 15 nm, which is the same value as the half-gap length (G) (gap length 2G=30 nm).

A cross-sectional area $S_0$ of the microstrip line is calculated as 15×15 ($nm^2$).

The total length (L) of the microstrip line was set to 150 nm. More specifically, the length of the main straight part 150a of the microstrip line shown in FIG. 2 was set to 100 nm, and the length of the side straight parts 150b formed at each of the main straight part was set to 25 nm, respectively. Therefore, as discussed above, the total length L was calculated as: (25+100+25)=150 nm.

Moreover, Au, which has low electric resistivity and good process compatibility (electric resistivity is approximately 15Ω), was used as the material for the microstrip line.

<Calculating a Reproduction Signal Voltage E Induced Due to Electromagnetic Induction by the in-Plane High Frequency Magnetic Field Crossing the Microstrip Line>

The reproduction signal voltage E is shown using an integral function. This integral function was introduced by the inventors of the present application.

Vacuum permeability $\mu_0$, a gap magnetic field Hg, a magnetic pole width w, the half-gap length G, the drive frequency f were determined as follows to calculate the reproduction signal voltage E by using the integral function. That is, the integration process was accomplished across domains of integration to determine an amount of total magnetic flux of the in-plane high frequency magnetic field that crosses over the microstrip line. The reproduction signal voltage E that the total magnetic flux induces was calculated by time derivatives.

Vacuum permeability $\mu_0 = 4\pi \times 10^{-7}$ (H/m)

Gap magnetic field Hg=80π(A/m); corresponding to $2 \times 10^4$ (G)=2 (T)

Magnetic pole width w=100×$10^{-9}$ (m); 100 nm

Half-gap length G=15×$10^{-9}$ (m); 15 (nm)

Drive frequency f=20×$10^{-9}$ (Hz); 20 (GHz)

As a result of the calculation, the reproduction signal voltage E (reproduction signal output S) was calculated as 100 (nV).

Next, the SNR for the reproduction output was calculated.

First, an electric resistivity R of the microstrip line was determined.

<Electric Resistivity R of Microstrip Line>

The electric resistivity R of the microstrip line is calculated by the following equation:

$R = (L \times \rho)/S_0$ where L is the length of the microstrip line, $S_0$ is the cross-sectional area, and ρ is the resistivity of Au.

As a result of the calculation, R became approximately 15Ω.

Further, a thermal noise voltage N (N: effective noise voltage in bandwidth (Johnson-Nyquist noise, thermal noise, Johnson noise, or Nyquist noise)) can be expressed with the following:

$N = \sqrt{\sqrt{4 \cdot K \cdot T \cdot R \cdot \Delta f}}(V)$

With respect to the equation, see Wikipedia, for example, where
- k: Boltzmann constant
- T: Absolute temperature
- R: Electric resistance
- Δf: Bandwidth of band-pass filter (1 GHz)

The mixer circuit was not used in the case of the comparative example. Therefore, the drive frequency was maintained at 20 GHz, and the signal detection was accomplished by using a band-pass filter having a bandwidth (Δf) of 1 GHz. As a result, the thermal noise voltage N became significantly greater than the reproduction signal output S. As a result, the SNR became negative, and a signal differentiation was not achieved in the case of the comparative example.

SNR (dB) can be calculated by the equation below:

SNR (db)=20 log(S/N)

Exemplary Embodiment

In a modification to the measurement circuit system used in the above-discussed comparative example, the measurement system 160 as shown in FIG. 4 was used. That is, the mixer circuit 170 was provided after the amplifier 162. The frequency inputted at 20 GHz was down-converted to 10 MHz, and a signal having the center frequency at 10 MHz was transmitted through the band-pass filter for the bandwidth of 3 KHz (±1.5 KHz) to produce the reproduction voltage.

When the above-discussed thermal noise voltage N was calculated in the measurement circuit system of the present invention, the thermal noise voltage N in the present embodiment was 38.5 (nV).

From the thermal noise voltage N being 38.5 (nV) and the reproduction voltage being 100 (nV), the SNR was determined as follows:

SNR=20 log(100/38.5)=8.3 (dB)

This value is greater than 3.0 dB and is confirmed to be a value that can be sufficiently differentiated.

Effects of the present invention are apparent from the above-discussed test results.

That is, a measurement circuit system of a magnetic field measurement apparatus of the present invention includes an amplifier, a mixer circuit and a band-pass filter that are connected in order on an output end side of a microstrip line or a coplanar wave guide, which is an in-plane high frequency magnetic field intensity measurement element. A frequency immediately before being inputted in the band-pass filter is down-converted by the mixer circuit to a frequency so that a band width of the band-pass filter can be used, the band-pass filter uses a narrow band of ±0.5-±10 KHz (1 KHz-20 KHz as a bandwidth) centering a fundamental frequency selected from 5-20 MHz that is down-converted by the mixer circuit as a center peak passing frequency, and the measurement circuit system is configured to obtain 3 dB or greater of a signal-to-noise ratio (SNR) that is a ratio of S with N; where S represents the reproduction voltage (reproduction output) of the high frequency reproduction signal induced by the in-plane high frequency magnetic field intensity measurement element, and N represents a total noise voltage of a circuit noise including a noise generated by the in-plane high frequency magnetic field intensity measurement element. Therefore, the in-plane high frequency magnetic field that a microwave-assisted magnetic head generates can be measured with high reliability and precision.

What is claimed is:

1. A magnetic field measurement apparatus that measures an in-plane high frequency magnetic field intensity generated from a microwave generation mechanism provided in a microwave-assisted magnetic head, the magnetic field measurement apparatus comprising:
   a fixing mechanism that fixes the microwave-assisted magnetic head that is a subject to be measured;
   a high frequency current drive system that applies a high frequency current to the microwave generation mechanism provided in the microwave-assisted magnetic head;
   an in-plane high frequency magnetic field intensity measurement element that measures the in-plane high frequency magnetic field intensity generated from the microwave generation mechanism, the in-plane high frequency magnetic field intensity measurement element being one of a microstrip line and a coplanar wave guide that functions to obtain a production output voltage by electromagnetic induction from the in-plane high frequency magnetic field generated from the microwave generation mechanism;
   a measurement circuit system connected to the one of the microstrip line and the coplanar wave guide, which is the in-plane high frequency magnetic field intensity measurement element; and
   a three-dimensionally movable stage on which is mounted the one of the microstrip line and the coplanar wave guide, which is the in-plane high frequency magnetic field intensity measurement element, wherein
   the measurement circuit system includes an amplifier, a mixer circuit and a band-pass filter that are connected in order on an output end side of the in-plane high frequency magnetic field,
   a frequency immediately before being inputted in the band-pass filter is down-converted by the mixer circuit to a frequency so that a band width of the band-pass filter can be used,
   the band-pass filter uses a narrow band of ±0.5-±10 KHz (1 KHz-20 KHz as a bandwidth) centering a fundamental frequency selected from 5-20 MHz that is down-converted by the mixer circuit as a center peak passing frequency, and
   the measurement circuit system is configured to obtain 3 dB or greater of a signal-to-noise ratio (SNR) that is a ratio of S with N;
   where
      S represents the reproduction voltage (reproduction output) of the high frequency reproduction signal induced by the in-plane high frequency magnetic field intensity measurement element, and
      N represents a total noise voltage of a circuit noise including a noise generated by the in-plane high frequency magnetic field intensity measurement element.

2. The magnetic field measurement apparatus according to claim 1, wherein the band-pass filter uses a narrow band of ±1.5-±5 KHz (3 KHz-10 KHz as a bandwidth) centering the fundamental frequency selected from 5-20 MHz that is down-converted by the mixer circuit as the center peak passing frequency.

3. The magnetic field measurement apparatus according to claim 1, wherein the fundamental frequency down-converted by the mixer circuit and inputted to the band-pass filter and the narrow bandwidth of the band-pass filter are determined such that 3 dB or greater is obtained for the SNR.

4. The magnetic field measurement apparatus according to claim 1, wherein the amplifier in the measurement circuit system includes a pre-amplifier and a main-amplifier that are connected in this order.

5. The magnetic field measurement apparatus according to claim 1, wherein the amplifier in the measurement circuit system is a main-amplifier.

6. The magnetic field measurement apparatus according to claim 1, wherein a comparator is connected to the measurement circuit system next to the band-pass filter.

7. The magnetic field measurement apparatus according to claim 1, wherein, by a control of the three-dimensionally movable stage,
   a center line of the one of the microstrip line or the coplanar wave guide is positioned along and opposes a center line of a recording gap of the microwave-assisted magnetic head that is the subject to be measured that is fixed by the fixing mechanism, and
   a spacing between the center line of the recording gap and the center line of the one of the microstrip line or the coplanar wave guide is configured to be finely controlled.

8. The magnetic field measurement apparatus according to claim 1, wherein the coplanar wave guide is of a short circuit type.

9. The magnetic field measurement apparatus according to claim 1, wherein the microwave-assisted head that is the subject to be measured includes a main magnetic pole, an auxiliary magnetic pole, a primary coil for generating a perpendicular recording magnetic field at the main magnetic pole, and a secondary coil for driving a microwave band alternating current in a gap and/or in a vicinity of the gap formed by the main magnetic pole and the auxiliary magnetic pole.

10. The magnetic field measurement apparatus according to claim 9, wherein
    an in-plane alternating current magnetic field is generated by driving the alternating current in the microwave band to the secondary coil of the microwave-assisted magnetic head, and
    a frequency of the alternating current is substantially equal to a ferromagnetic resonance frequency of a recording layer of a magnetic recording medium that is subjected to recording, and is in a range of 10 GHz to 40 GHz.

11. The magnetic field measurement apparatus according to claim 1, wherein the microwave-assisted magnetic head that is the subject to be measured includes a main magnetic pole, an auxiliary magnetic pole, a primary coil for generating a perpendicular recording magnetic field at the main magnetic pole, and a spin torque oscillator formed of a multilayer magnetic thin film for generating a microwave band alternating current in a gap and/or in a vicinity of the gap formed by the main magnetic pole and the auxiliary magnetic pole.

12. The magnetic field measurement apparatus according to claim 11, wherein
    an in-plane alternating current magnetic field is generated by driving a bias current to the spin torque oscillator of the microwave-assisted magnetic head to oscillate the spin torque oscillator, and
    an oscillation frequency of the spin torque oscillator is substantially equal to a ferromagnetic resonance frequency of a recording layer of a magnetic recording medium that is subjected to recording, and is in a range of 10 GHz to 40 GHz.

* * * * *